(12) United States Patent
Lee (10) Patent No.: US 10,090,175 B2
(45) Date of Patent: Oct. 2, 2018

(54) APPARATUS FOR MANUFACTURING SEMICONDUCTOR WAFER

(71) Applicant: SCIENTIFIC VALUE SOLUTIONS CO. LTD, Anseong-si (KR)

(72) Inventor: Jin Woo Lee, Pyeongtaek-si (KR)

(73) Assignee: SCIENTIFIC VALUE SOLUTIONS CO. LTD, Anseong-si (KR)

( * ) Notice: Subject to any disclaimer, the term of this patent is extended or adjusted under 35 U.S.C. 154(b) by 876 days.

(21) Appl. No.: 14/410,190

(22) PCT Filed: Jun. 24, 2013

(86) PCT No.: PCT/KR2013/005558
§ 371 (c)(1),
(2) Date: Dec. 22, 2014

(87) PCT Pub. No.: WO2013/191520
PCT Pub. Date: Dec. 27, 2013

(65) Prior Publication Data
US 2015/0340249 A1    Nov. 26, 2015

(30) Foreign Application Priority Data

Jun. 22, 2012 (KR) .................. 10-2012-0067613
Jun. 22, 2012 (KR) .................. 10-2012-0067634

(51) Int. Cl.
*H01L 21/67*    (2006.01)
*H01L 21/683*   (2006.01)
(Continued)

(52) U.S. Cl.
CPC ........ *H01L 21/6708* (2013.01); *C25D 17/001* (2013.01); *C25D 17/004* (2013.01);
(Continued)

(58) Field of Classification Search
CPC ............. H01L 21/6708; H01L 21/6833; H01L 21/68764; H01L 21/68785; H01L 21/6719;
(Continued)

(56) References Cited

U.S. PATENT DOCUMENTS 6,248,398 B1 *  6/2001  Talieh ................. G03F 7/162
                                                        118/319
2001/0014224 A1 * 8/2001 Hasebe ................ G03F 7/162
                                                        396/579
(Continued)

FOREIGN PATENT DOCUMENTS

JP    1999092947    4/1999
JP    1999279797    10/1999
(Continued)

OTHER PUBLICATIONS

International Search Report—PCT/KR2013/005558 dated Jul. 30, 2013.

*Primary Examiner* — Charles Capozzi
*Assistant Examiner* — Mirza Israr Javed
(74) *Attorney, Agent, or Firm* — Cantor Colburn LLP (57) ABSTRACT

An apparatus for manufacturing a semiconductor wafer comprises: a wafer chuck which holds the rear surface of a wafer having a via hole; a cap which is installed in such a way as to move up and down above the wafer chuck and has a sealed lip which forms a liquid reservoir by sealing the outer peripheral portion of the upper surface of the wafer; and a nozzle which injects and recovers processing liquids to and from a reaction chamber.

27 Claims, 9 Drawing Sheets

(51) Int. Cl.
    *H01L 21/687*     (2006.01)
    *C25D 17/00*     (2006.01)
    *H01L 21/288*     (2006.01)
    *H01L 21/768*     (2006.01)

(52) U.S. Cl.
    CPC ...... H01L 21/6719 (2013.01); H01L 21/6833 (2013.01); H01L 21/68764 (2013.01); H01L 21/68785 (2013.01); *H01L 21/2885* (2013.01); *H01L 21/76898* (2013.01)

(58) Field of Classification Search
    CPC .......... H01L 21/2885; H01L 21/76898; C25D 17/001; C25D 17/004
    See application file for complete search history.

(56) References Cited

U.S. PATENT DOCUMENTS

2003/0141018 A1*   7/2003   Stevens ............. H01L 21/67126
                                                                   156/345.51
2004/0234696 A1    11/2004   Hongo et al.
2006/0269877 A1*  11/2006   Boyd ........................ B08B 3/04
                                                                   430/326

FOREIGN PATENT DOCUMENTS

| JP | 2000256897 | 9/2000 |
| JP | 4010791 | 9/2007 |
| KR | 101043229 | 6/2011 |

\* cited by examiner

APPARATUS FOR MANUFACTURING SEMICONDUCTOR WAFER

TECHNICAL FIELD

The present invention relates to an apparatus and method for manufacturing a semiconductor wafer to form a patterned electrically-conductive layer on a wafer.

BACKGROUND ART

A process for forming a pattern electrically-conductive layer on a wafer may include a dry etching process and a wet etching process.

As electronics are gradually miniaturized and large-scaled, semiconductors having high integration are needed. To form a highly integrated pattern on a substrate, film uniformity has to be improved, as well as, a pattern having a high aspect ratio in a thickness direction is needed.

To improve integration on a plane, a material having high conductivity such as copper and gold as materials for a line has to be used with a thin thickness and has film uniformity to form a layer having a thin thickness. In case of the wet process, in order to improve the film uniformity, a chemical material has to be constantly maintained in concentration. In case of the conventional wet process, it is difficult to uniformly maintain the concentration of the chemical material.

Also, the method for improving only the integration on the plane meets with limitation. Thus, a through silicon via (TSV) method in which a vertically electrical connection part is formed in a chip has been disclosed as one of 3D packaging methods for stacking a plurality of chips on one package. To utilize the TSV method, unlike a method for simply forming a circuit on a semiconductor surface, a process for filling a conductor in a via hole that is narrowly lengthily formed in a thickness direction is needed. Particularly, a process for forming a conductor, an insulation layer, and a barrier layer in the narrow and long via hole may cause many problems.

In case of the drying process, when compared to the wet process, it is difficult to uniformly form the conductor in the via hole that is narrowly lengthily formed at a high aspect ratio.

In case of the wet process, a process in which a cleaning process is performed after a surface of a wafer is disposed downward to face a tank containing a chemical material and then react has been generally known. However, this process has problems in which a large amount of chemical material is wastefully consumed, a rear surface of the wafer is contaminated, and the wafer moves by a separate device to clean the chemical material in a state where the surface of the wafer is coated with the chemical material.

As described above, to highly integrate the semiconductor pattern on the wafer, development of an apparatus for manufacturing a semiconductor wafer, which is capable of realizing a pattern having a high aspect ratio, is urgent.

DISCLOSURE OF THE INVENTION

Technical Problem

To solve the above-described problems, embodiments of the present invention provide an apparatus for manufacturing a semiconductor wafer, which is capable of forming a pattern having a high aspect ratio, improving film uniformity, reducing usage of a chemical material, preventing a wafer from being contaminated, and reducing the number of equipment for performing processes.

Technical Solution

To solve the above-described objects, the embodiment of the present invention provides an apparatus for manufacturing a semiconductor wafer, the apparatus including: a wafer chuck supporting and fixing a rear surface of the wafer; a cap elevatably disposed above the wafer chuck, the cap including a sealed lip that seals an outer peripheral portion of a top surface of the wafer to define a liquid reservoir; and a nozzle injecting and recovering a processing liquid into the liquid reservoir.

Here, the apparatus may further include: a first electrode installed to apply electricity to the wafer; and a second electrode disposed to vertically face the wafer chuck with the wafer therebetween, the second electrode rotating to stir the processing liquid supplied onto the wafer.

Also, the apparatus may further include: a chuck rotation part rotating the wafer chuck; and a processing liquid recovery part disposed to surround an outer circumference of the wafer fixed to the wafer chuck, thereby recovering the scattered processing liquid.

Also, the apparatus may further include: a processing liquid supply part coupled to the nozzle to inject the processing liquid; and an ejector coupled to the nozzle to recover the processing liquid.

Also, the cap may further include a drain part surrounding an outer circumference of the liquid reservoir so that the processing liquid stored in the liquid reservoir overflows and is discharged.

Here, the cap may further include: an inner chamber defining the liquid reservoir, the inner chamber allowing the processing liquid to overflow; and an outer chamber surrounding an outer circumference of the inner chamber to define a recovery space, in which the overflowing processing liquid is recovered, between the inner chamber and the outer chamber, the outer chamber having a discharge hole in one side of the recovery space.

The second electrode may include a plurality of second electrode blade members expanded in a direction that is away from a rotation center of the second electrode and equally divided along a rotational circumferential direction.

Each of the second electrode blade members may have a fan shape.

The apparatus may further include a chuck elevation device for vertically elevating the wafer chuck, wherein the processing liquid recovery part may include: an inner processing liquid recovery part surrounding the wafer fixed to the wafer chuck in a state where the wafer chuck descends by the chuck elevation device to recover the processing liquid supplied onto the wafer; and an outer processing liquid recovery part disposed outside the inner processing liquid recovery part to surround the wafer fixed to the wafer chuck, thereby recovering the processing liquid scattered from the wafer when the wafer chuck rotates in a state where the wafer chuck ascends to an upper side of the inner processing liquid recovery part by the chuck elevation device.

Here, the inner processing liquid recovery part may be disposed under the cap to vertically ascend or descend by the vertical elevation of the cap or is variable in vertical length.

Also, the inner processing liquid recovery part may include a lower chamber and an upper chamber disposed on the lower chamber so as to be vertically elevated by an elastic member that is vertically elastically deformable.

The elastic member may be disposed in the lower chamber, and the apparatus may further include a connection member disposed between the elastic member and the upper chamber to pass through the lower chamber so that the lower chamber is vertically elevatable.

The upper chamber may have a first groove into which the lower chamber is vertically inserted and a second groove that extends upward from the first groove so that the connection member is fitted.

An upper end of the inner processing liquid recovery part may be inclined toward the wafer chuck with respect to a vertical direction.

An upper end of the outer processing liquid recovery part may be inclined toward the wafer chuck with respect to a vertical direction.

The inner chamber may be disposed lower than the outer chamber and has a recovery hole connected to the recovery space of the outer chamber in an upper portion thereof, and the cap may further include an annular skirt spaced a predetermined distance from the inner chamber and surrounded by the inner chamber, the annular skirt being disposed higher a lower end of the inner chamber and having an upper end disposed higher than that of the inner chamber.

An outer chamber-side size of the recovery hole of the inner chamber may be greater than an inner chamber-side size thereof.

The upper end of the inner chamber may have an inner surface that is vertically disposed and an outer surface that is inclined to be tapered upward.

The upper end of the inner chamber may have a sawtooth shape along a circumferential direction thereof.

The inner chamber may further include a drain hole connected to the recovery space in a lower portion thereof that is lower than the recovery hole.

Here, the drain hole may be inclined downward from the inner chamber toward the outer chamber.

The outer chamber may have a dome shape, and the annular skirt may be supported by the outer chamber, and the apparatus may further include a first electrode disposed on the wafer chuck and a second electrode that interacts with the first electrode to rotate and is disposed on the cap to stir the processing liquid.

The ejector may use a vacuum manner performed by a compressed air that is introduced and discharged at a high speed.

The nozzle may be connected to the ejector through a connection tube that is detachably fitted into and coupled to an upper portion of the nozzle.

The apparatus may further include a tank connected to the ejector to store the supplied or recovered processing liquid, wherein the processing liquid supply part may supply a pressure gas to allow the processing liquid within the tank to forcibly flow into the nozzle, and the apparatus may further include a valve connecting the tank to the processing liquid supply part when the processing liquid is supplied and connecting the tank to the ejector when the processing liquid is recovered.

Advantageous Effects

As described above, various effects including the following facts may be expected according to the technical problems of the present invention. However, it is unnecessary to allow all of the following effects to be exerted.

First, as described above, the cap having the sealed lip may be disposed on the top surface of the wafer to allow only a small amount of processing liquid to react, thereby reducing the usage of the processing liquid and preventing the rear surface of the wafer and other portions of the equipment from being contaminated.

Also, since the processing liquid remaining on the wafer is removed by rotating the wafer chuck, the other process may be performed without moving the wafer to the other equipment.

Also, the processing liquid supply part and the ejector may be provided to increase the recycled proportion of processing liquid.

Also, the processing recovery part may prevent the processing liquid scattered from the wafer from being permeated into other portions of the equipment. Particularly, since the processing liquid recovery part is constituted by the inner processing liquid recovery part and the outer processing liquid recovery part to allow the wafer chuck to be elevated by the chuck elevation device, the processing liquids supplied for respective stages may be separately recovered.

Also, since the cap descends while pushing the inner processing liquid recovery part, and the inner processing liquid recovery part returns to or ascends its original position by the elastic restoring force thereof, the structural interference between the cap and the inner processing liquid recovery part may be prevented.

Also, the processing liquid may be stirred by the second electrode to more activate the processing liquid, thereby uniformly processing the wafer. In addition, it may be unnecessary to additionally provide a separate component for stirring the processing liquid.

Also, the via hole processing process, cleaning process, and drying process for the wafer may be performed through only one equipment to improve efficiency.

MODE FOR CARRYING OUT THE INVENTION

Hereinafter, exemplary embodiments will be described in detail with reference to the accompanying drawings.

Figure 1:
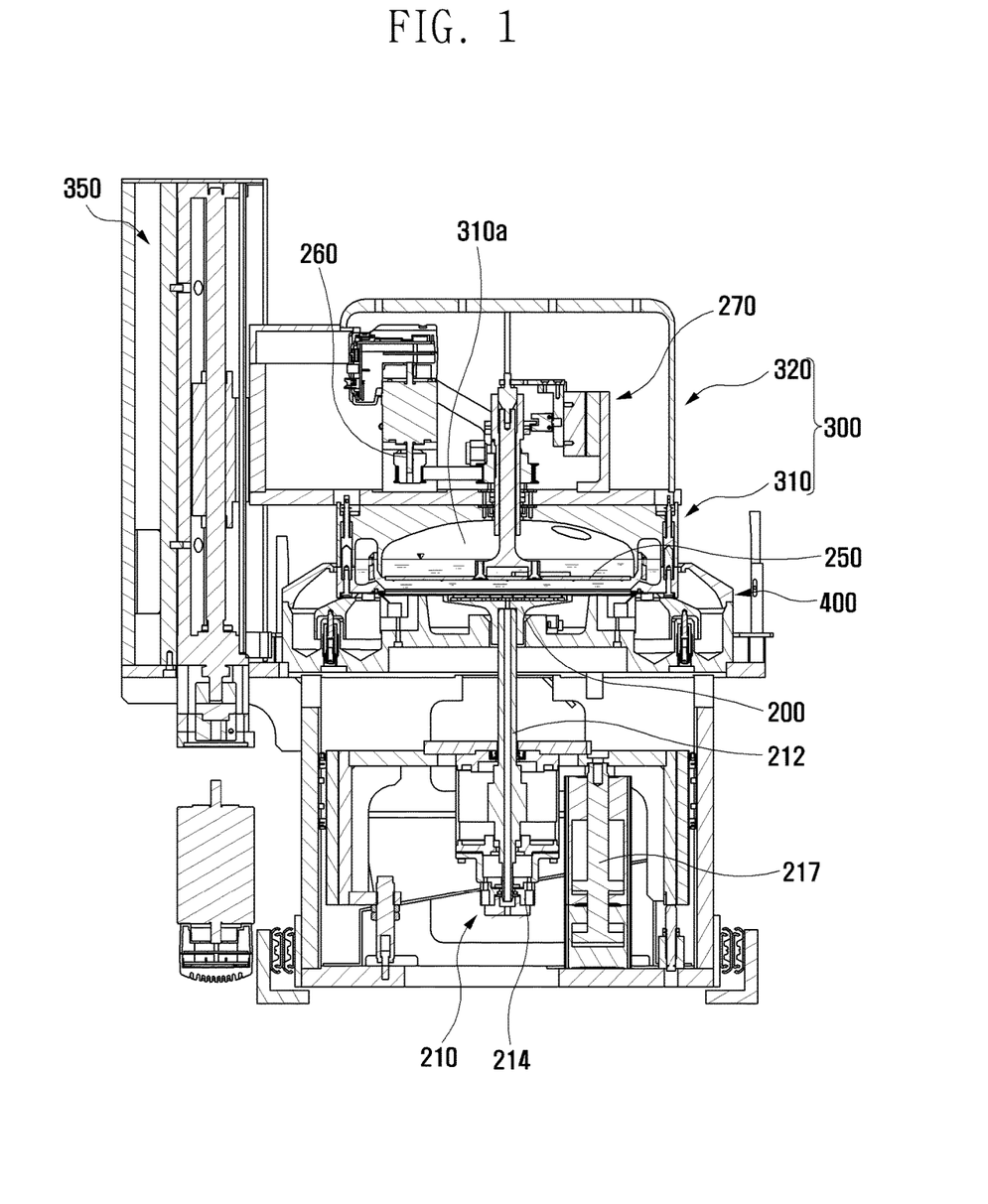
FIG. 1 is a conceptual cross-sectional view of an apparatus for manufacturing a semiconductor wafer according to an embodiment of the present invention (cap descending and wafer chuck descending).
Figure 2:
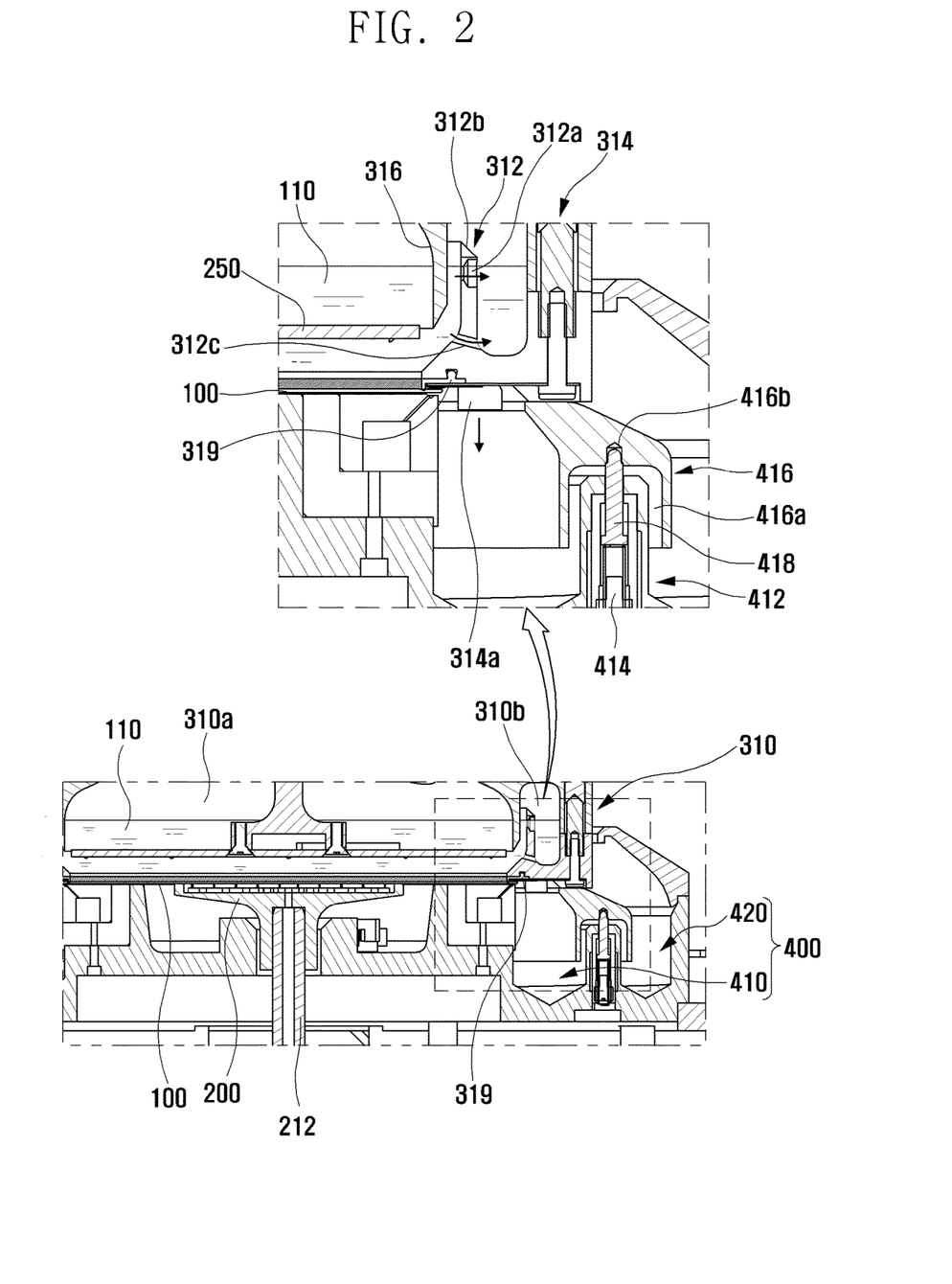
FIG. 2 is an enlarged view illustrating a portion of FIG. 1.
Figure 3:
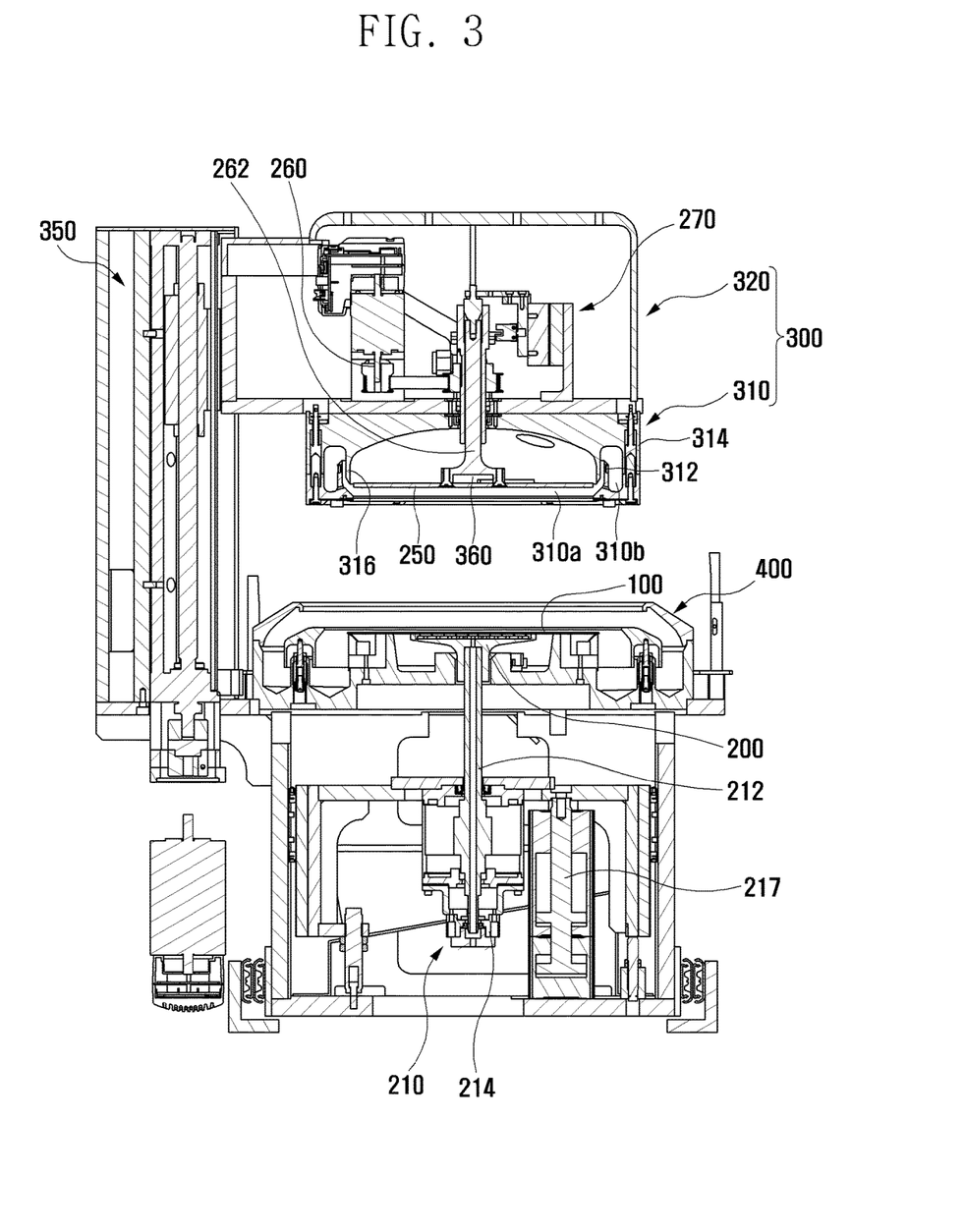
FIG. 3 is a conceptual cross-sectional view illustrating cap ascending and wafer chuck descending in the apparatus of FIG. 1.
Figure 4:
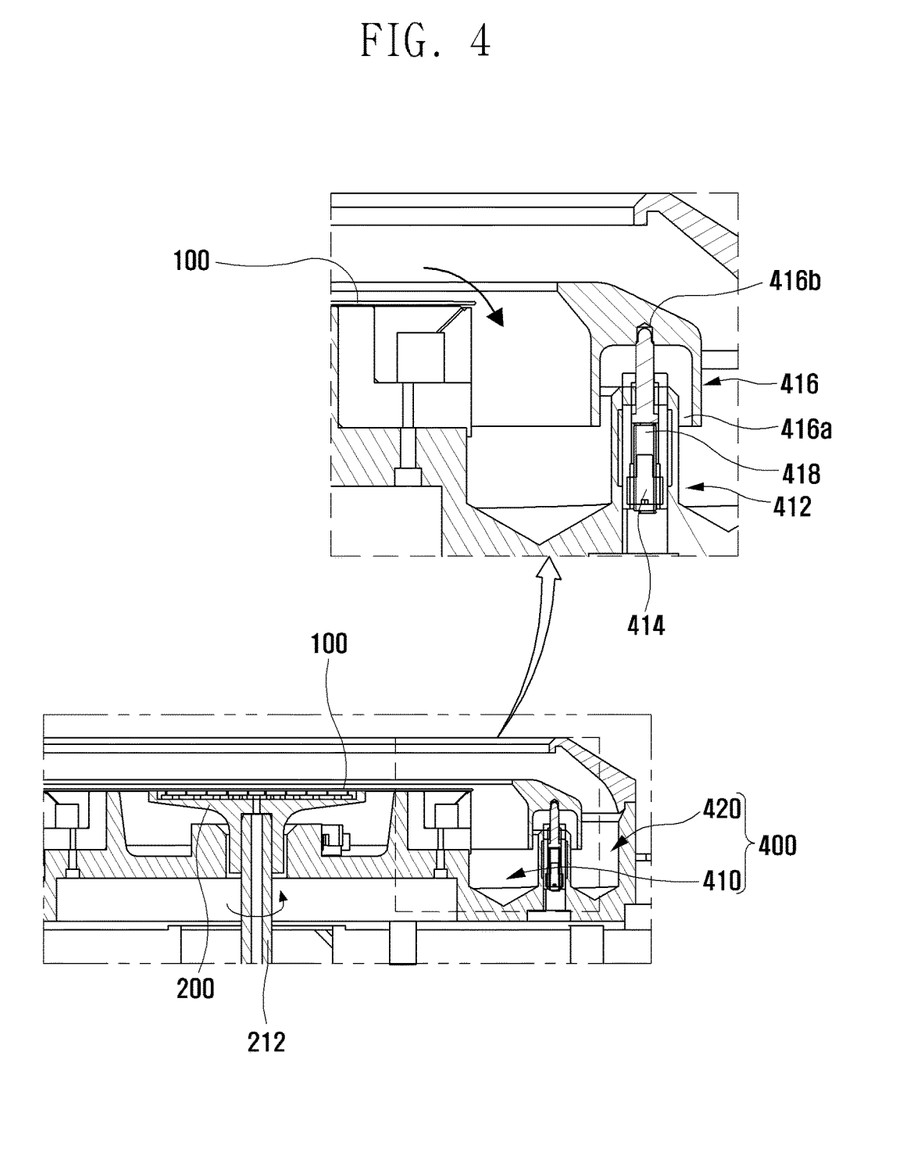
FIG. 4 is an enlarged view illustrating a portion of FIG. 3.
Figure 5:
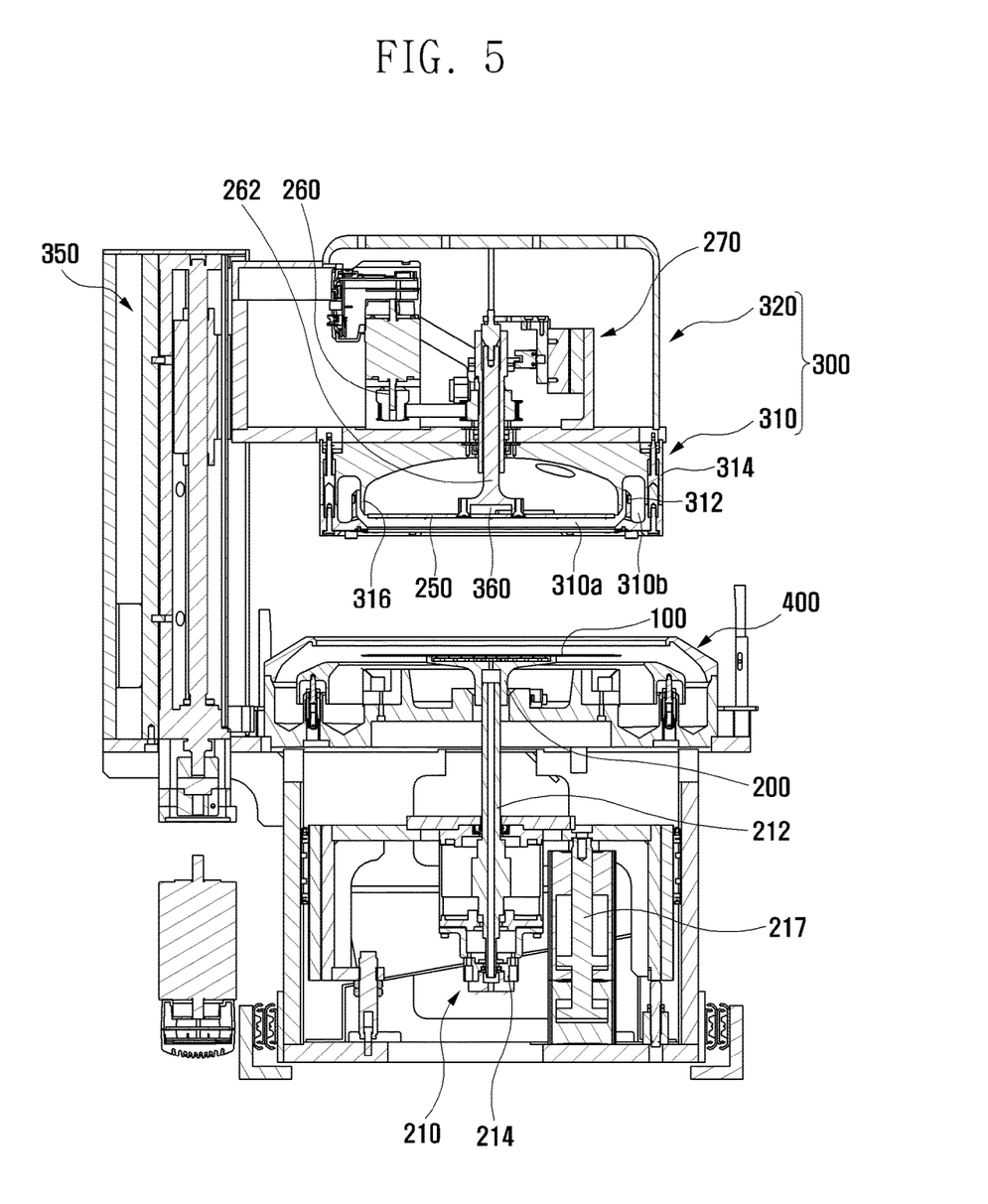
FIG. 5 is a conceptual cross-sectional view showing cap ascending and wafer chuck ascending in the apparatus of FIG. 1.
Figure 6:
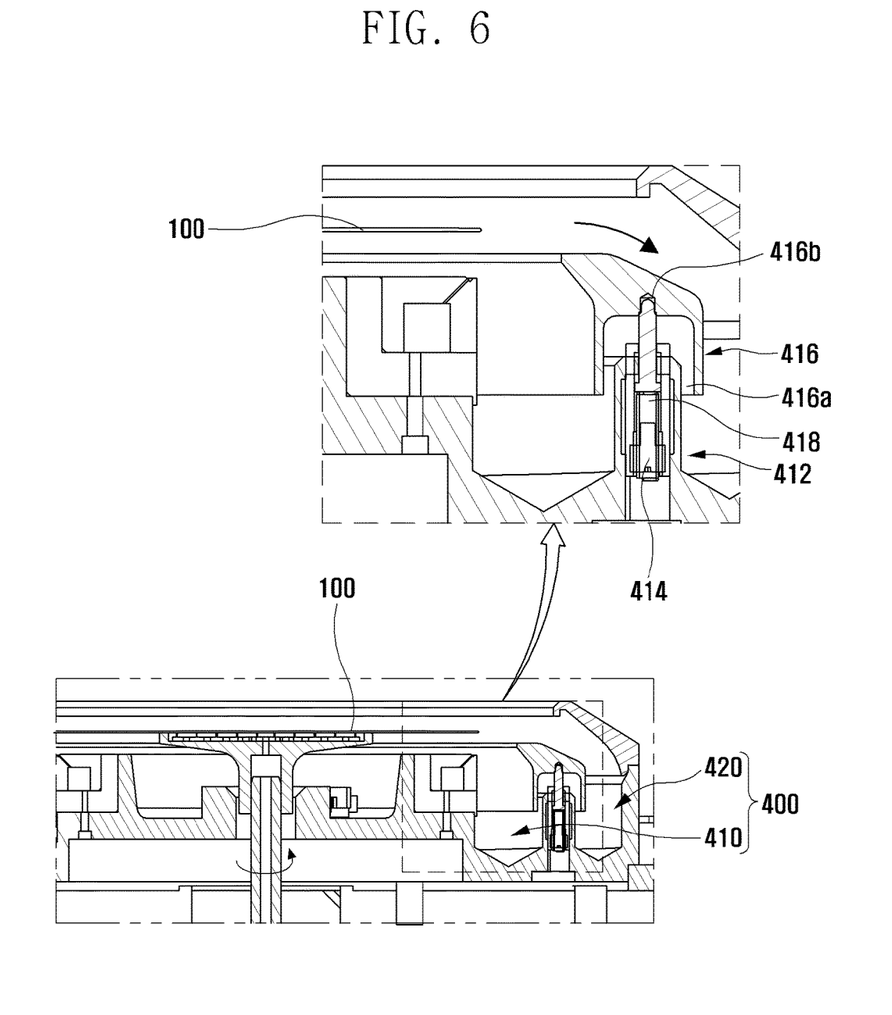
FIG. 6 is an enlarged view illustrating a portion of FIG. 5.
Figure 7:
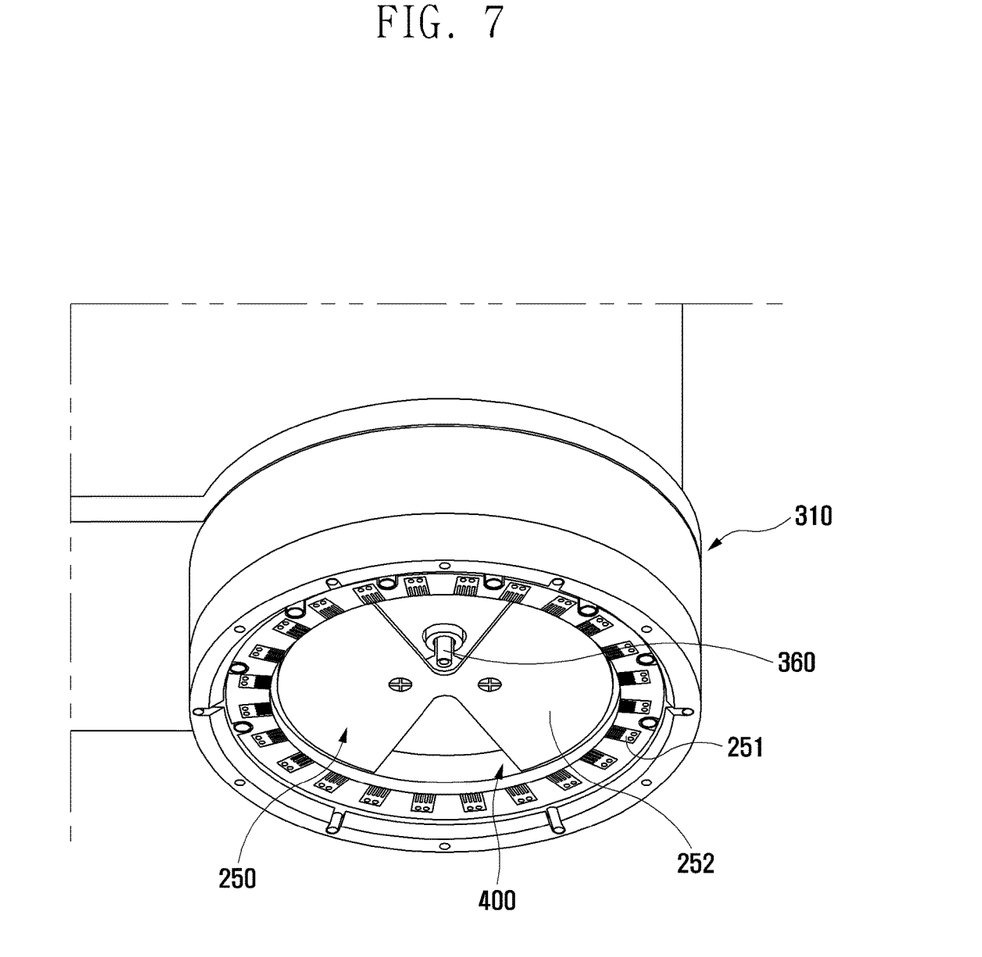
FIG. 7 is a partial perspective view of a second electrode and bottom surface of the cap of FIG. 1.

FIG. 1 is a conceptual cross-sectional view of an apparatus for manufacturing a semiconductor wafer according to an embodiment of the present invention (cap descending and wafer chuck descending), FIG. 2 is an enlarged view illustrating a portion of FIG. 1, FIG. 3 is a conceptual cross-sectional view of the apparatus for manufacturing the semiconductor wafer according to an embodiment of the present invention (cap ascending and wafer chuck descending), FIG. 4 is an enlarged view illustrating a portion of FIG. 3, FIG. 5 is a conceptual cross-sectional view of the apparatus for manufacturing the semiconductor wafer according to an embodiment of the present invention (cap ascending and wafer chuck ascending), FIG. 6 is an enlarged view illustrating a portion of FIG. 5, and FIG. 7 is a partial perspective view of a second electrode and bottom surface of the cap of FIG. 1.

As illustrated in the drawings, an apparatus for manufacturing a semiconductor wafer according to an embodiment of the present invention may include a wafer chuck 200 for supporting and fixing a rear surface of a wafer 100, a cap 300 disposed above the wafer chuck 200 to ascend and descend, the cap 300 having a sealed lip 319 for sealing an outer peripheral portion of a top surface of the wafer 100 to form a liquid reservoir 310a, a nozzle 360 for injecting and recovering a processing liquid into the liquid reservoir 310a, a first electrode 251 for applying electricity to the wafer 100, a second electrode 250 disposed to vertically face the wafer chuck 200 with the wafer 100 therebetween, the second electrode 250 being rotated to stir the processing liquid supplied onto the wafer 100, a chuck rotation part 210 for rotating the wafer chuck 200, a chuck elevation device 217 for vertically elevating the wafer chuck 200, and a processing liquid recovery part 400 disposed to surround a circumference of the wafer 100 fixed to the wafer chuck 200 to recover the scattered processing liquid 110.

A driving shaft 212 of the chuck rotation part 210 may be integrally coupled to a lower center of the wafer chuck 200, and thus the wafer chuck 200 may receive the rotation force to rotate. The chuck rotation part 210 may include a motor 214. Here, a servo motor may be applied as the motor so that the motor is adjusted in rotation rate. The wafer chuck 200 may be vertically elevated by the chuck elevation device 217. The chuck elevation device 217 may include a solenoid and pneumatic cylinder. However, their detailed descriptions will be omitted.

The cap 300 may be vertically elevated at an upper side of the wafer chuck 200 by the cap elevation device 350 so that the wafer 100 is loaded on or unloaded from the wafer chuck 200. The cap elevation device 350 may include a rack, a pinion, or a cylinder. However, their detailed descriptions will be omitted.

The cap 300 may include a lower cap 310 having a dome structure in general to store a processing liquid 110 to be supplied onto the wafer 100 and discharge the stored processing liquid 110 through overflow of the processing liquid 110 and an upper cap 320 disposed on the lower cap 310.

The lower cap may include the liquid reservoir 310a surrounding the circumference of the wafer 100 fixed to the wafer chuck 200 to store the processing liquid 110 and a drain part 310b discharging the processing liquid 110 that overflows from the liquid reservoir 310a. That is, the lower cap 310 may include an inner chamber 312 defining the liquid reservoir 310a to allow the processing liquid 110 to overflow and an outer chamber 314 surrounding a circumference of the inner chamber 312 to define the drain part 310b that is a recovery space, into which the overflowing processing liquid 110 is recovered, between the inner chamber 312 and the outer chamber 314, wherein a discharge hole 314a is defined in one side of the drain part 310b.

The inner chamber 312 may have a recovery hole 312a passing through the inner chamber 312 to communicate with the recovery space of the outer chamber 314 in an upper portion (that is, a position higher than a vertical middle position of the inner chamber 312) so that the processing liquid 110 overflows from the liquid reservoir 310a to the drain part 310b. The recovery hole 312a may have a diameter that gradually decreases in a flowing direction of the processing liquid 110 so that the processing liquid 110 easily overflows without having flow resistance or decreases in stages, like a stair structure, so that an outer chamber-side diameter of the recovery hole 312a is greater than an inner chamber-side diameter thereof. Also, the inner chamber 312 may have an annular shape with a height that is lower than that the outer chamber 314 so that the excessively supplied processing liquid 110 smoothly overflows from the liquid reservoir 310a to the drain part 310b. Here, an upper end 312b of the inner chamber 312 may be tapered upward so that the overflowing processing liquid 110 more easily flows over the upper end 312b of the inner chamber 312 from the liquid reservoir 310a to the drain part 310b. Also, an inner surface of the inner chamber 312 may be vertically disposed, and an outer surface of the inner chamber 312 may be inclined. Also, the upper end 312b of the inner chamber 312 may have a sawtooth shape in which an unevenness is repeatedly formed along a circumference (that is, a circumferential direction of a circle) of an inner end of the inner chamber 312 so that the processing liquid 110 uniformly flows over the circumference of the inner chamber 312 without flowing along only a portion of the circumference of the inner chamber 312. Also, a drain hole 312c connected to the recovery space of the outer chamber 314 may be further defined in a lower portion that is lower than the recovery hole 312a, preferably, a position that is close to a lower end of the inner chamber 312. Thus, even though a level of the processing liquid 110 is lowered after the processing process for the wafer 100 is finished, the processing liquid 110 may be easily discharged through the drain hole 312c. The drain hole 312c of the inner chamber 312 may be inclined downward from the inner chamber 312 toward the outer chamber 314 to easily guide the processing liquid 110 from the reservoir 310a to the drain part 310b. The outer chamber 314 may have a dome shape with an inner space that has an opened bottom surface.

Also, the lower cap 310 may further include an annular skirt 316 so that the supplied processing liquid 110 is discharged after the processing liquid 110 sufficiently stays in the inner chamber 312. The skirt 316 may be disposed in the inner chamber 312 so that the skirt 316 is surrounded by the inner chamber 312. Also, the skirt 316 may be spaced a predetermined distance from the inner chamber 312 in a radius direction of the circle so that a space into which the processing liquid 110 overflows is secured between the inner chamber 312 and the skirt 316. Also, the skirt 316 may be disposed above the lower end of the inner chamber 312, and an upper end of the skirt 316 is disposed higher than that of the inner chamber 312 so that the processing liquid 110 overflows to the outer chamber 314. The upper end of the skirt 316 may be connected to the outer chamber 314 so that the skirt 316 is supported by the outer chamber 314.

The nozzle 360 for guiding the processing liquid 110 to supply and recover the processing liquid 110 may be disposed on the cap 300. The nozzle 360 may be installed to be elevated by the nozzle elevation device that is disposed in the upper cap 300. The nozzle elevation device may include a rack, a pinion, or a cylinder. However, their detailed descriptions will be omitted. The nozzle 360 may be connected to a vacuum ejector for recovering the supplied processing liquid 110.

The processing liquid recovery part 400 may have a double structure that is constituted by an inner processing liquid recovery part 410 and an outer processing liquid recovery part 420 to separately recover the processing liquid 110 according to kinds of processing liquids.

The inner processing liquid recovery part 410 may surround the wafer 110 fixed to the wafer chuck 200 when the wafer chuck 200 descends by the chuck elevation device to recover the processing liquid 110 that is supplied onto to the wafer 100.

Particularly, the inner processing liquid recovery part 410 may include a lower chamber 412 and an upper chamber 416 disposed on the lower chamber 412 and vertically elevated by an elastic member 414 that is vertically elastically deformable so that the inner processing liquid recovery part 410 varies in vertical length by the vertical elevation of the cap 300 at a lower side of the cap 300. That is, the lower chamber 412 may have a cylindrical shape with an upper top surface and be fixed to a position that is lower than the descending position of the wafer chuck 200. A circumferential surface of the lower chamber 412 may have a hollow structure so that the elastic member 414 is disposed in the circumferential surface of the lower chamber 412.

The upper chamber 416 may have an annular shape and be disposed on the circumferential surface 412a of the lower chamber 412. The upper chamber 416 may have a first groove 416a in which the circumferential surface of the lower chamber 412 is vertically inserted so that the upper chamber 416 is vertically fitted into and coupled to the lower chamber 412. An upper end of the upper chamber 416, i.e., an upper end of the inner processing liquid recovery part 410 may be inclined at a predetermined angle toward the wafer chuck 200 in a vertical direction to prevent the processing liquid 110 to be recovered into the inner processing liquid recovery part 410 from being introduced into the outer processing liquid recovery part 420 and to introduce the processing liquid 110 scattered from the wafer chuck 200 by the rotation of the wafer chuck 200 without being introduced into the inner processing liquid recovery part 410.

The elastic member 414 may be provided in various shapes if the elastic member 414 is disposed between the upper chamber 416 and the lower chamber 412. Preferably, the elastic member 414 may be disposed in the circumferential surface 412a of the lower chamber 412 and also guided to be elastically deformed in only a vertical direction by the lower chamber 412. If the elastic member 414 is vertically elastically deformable, the elastic member 414 may not be limited in material and structure. For example, a coil spring may be provided as the elastic member 414. A plurality of elastic members 414 or one elastic member 414 having an annular shape may be disposed along the circumferential direction of the lower chamber 412. Furthermore, a connection member 418 passing through the lower chamber 412 so that the connection member 418 is vertically elevated to allow the coil spring disposed in the lower chamber 412 to be easily connected to the upper chamber 416 may be disposed between the elastic member 414 and the upper chamber 416. A plurality of connection members 418 each of which has a pin shape or one connection member 418 having an annular shape may be provided to be fitted into a second groove 416b of the upper chamber 416 that extends upward from the first groove 416a.

According to another embodiment, the inner processing liquid recovery part 410 may be integrally elevated according to the elevation of the cap 300 by the elastic force, like the upper chamber 416 without being divided into the lower chamber 412 and the upper chamber 416.

The outer processing liquid recovery part 420 may be disposed outside the inner processing liquid recovery part 410 to surround the wafer fixed to the wafer chuck 200 so that the processing liquid 110 scattered from the wafer 100 is recovered when the wafer chuck 200 rotates by the chuck rotation part 210 in a state where the wafer chuck 200 is elevated to an upper side of the inner processing liquid recovery part 410 by the chuck elevation device. The outer processing liquid recovery part 420 may have a cylindrical shape with a height higher than a maximum height of the inner processing liquid recovery part 410. Also, the upper end of the outer processing liquid recovery part 420 may be inclined at a predetermined angle toward the wafer 100 with respect to the vertical direction to prevent the processing liquid 110 remaining on the wafer 100 from being scattered to the outside.

The processing liquid 110 may be determined according to various processes for forming a conductive pattern of the wafer 100. For example, the processing liquid 110 may be composed of a chemical element such as copper for forming a conductive layer on the wafer 100. Also, the processing liquid 110 may include a cleaning liquid as a post-processing liquid 110 to clean the wafer 100 after a processing process is performed using a main processing liquid 110.

Also, the first electrode 251 may be provided as a negative electrode to conduct electricity to the wafer 100. That is, the first electrode 251 may be disposed on a contact point between the cap 300 and the wafer 100. However, this is not limited thereto. For example, if the first electrode 251 applies the electricity to the wafer 100, the first electrode 251 may have various shapes. The second electrode 250 may be provided as a positive electrode that is opposite to the first electrode. The second electrode 250 may be disposed above the wafer chuck 200 on the outer chamber and thus be supported by the cap 300. Particularly, the second electrode 250 may be surrounded by the annular skirt to correspond to the wafer 100. Also, the second electrode 250 may be rotatably disposed on the cap 300 about the vertical direction to stir the processing liquid 110 supplied onto the wafer 100. That is, a second electrode motor for rotating the second electrode 250 may be disposed in the cap 300, particularly, the upper cap 320, and the second electrode 250 may be coupled to a rotation shaft 262 of the second electrode motor 260 to integrally rotate. Also, the second electrode 250 may be elevated by an electrode elevation device 270 disposed in the upper cap 300. The electrode elevation device 270 may include a rack, a pinion, or a cylinder, but their detailed descriptions will be omitted.

Also, the second electrode 250 may include a plurality of electrode blade members 252 disposed along a rotational circumference direction to easily stir the processing liquid 110. The plurality of second electrode blade members 252 may be equally disposed to uniformly stir the processing liquid 110 and allow the wafer to which the first electrode is connected to uniformly interact with the second electrode 250. Each of the second electrode blade members 252 may have a flat plate shape so that the second electrode blade members 252 are disposed in parallel to the wafer 100 to interact with the wafer to which the first electrode is connected. Also, each of the second electrode blade members 252 may be expanded in a direction that is away from a rotation center of the second electrode 250 to provide the same rotation ratio to the rotation center and a rotational outer circumferential end so that the wafer and the second electrode 400 uniformly interact with each other along the rotational radius direction. Preferably, each of the second electrode blade members 252 may have a fan shape.

Figure 8:
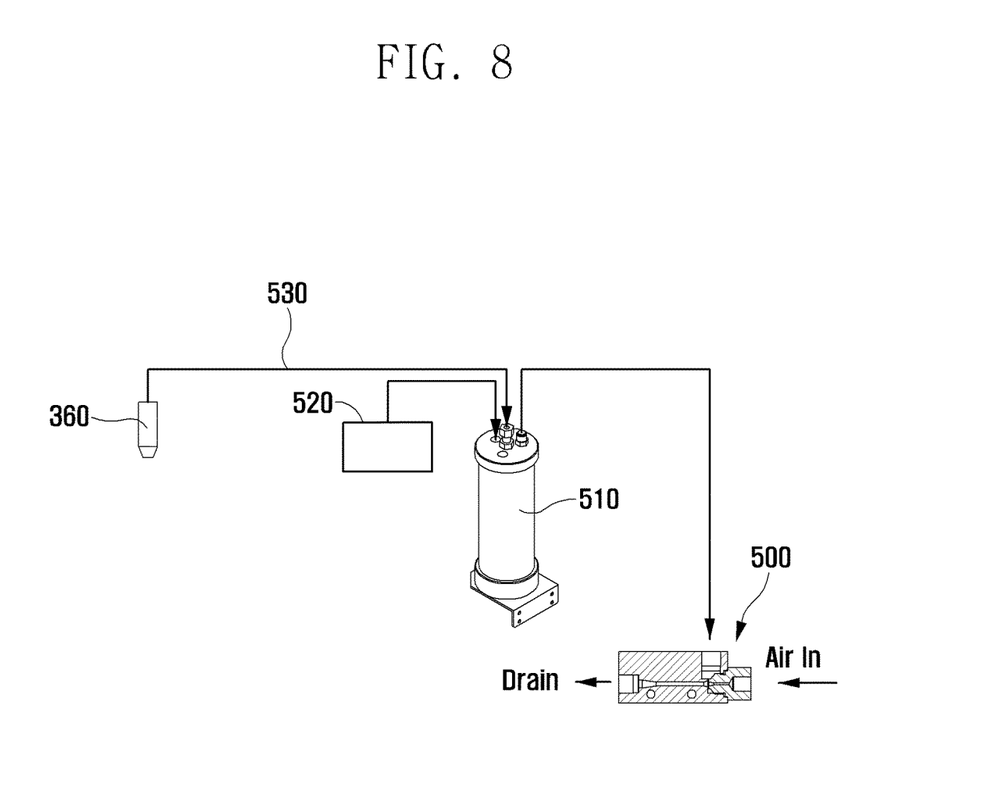
FIG. 8 is a conceptual view of a processing liquid supply part connected to a nozzle and ejector of FIG. 1.

FIG. 8 is a conceptual view of a processing liquid supply part connected to the nozzle and ejector of FIG. 1.

Referring to FIG. 8, the apparatus for manufacturing the semiconductor wafer according to an embodiment of the present invention further include a processing liquid supply part 520 connected to the nozzle 360 to inject the processing liquid and an ejector 500 for recovering the processing liquid.

The nozzle 360 may provide a recovery passage through which the processing liquid is supplied or recovered, or a connection tube 530 for supplying or recovering the processing liquid may be fitted into and coupled to an upper portion of the nozzle 360. Also, the nozzle 360 may have an inner passage that vertically passes therethrough so that the connection tube 530 vertically passes through the nozzle 360. The connection tube 530 may be provided as a rubber hose having superior fluidity. Also, the connection tube 530 may be detached from the nozzle 360 since the connection tube 530 is fitted into and coupled to the nozzle 360.

The ejector 500 may be provided as a vacuum type ejector for introducing and discharging the processing liquid at a high speed by using compressed air to stably recover the processing liquid.

The ejector 500 may be connected to the nozzle 360 through the connection tube 530 to recover the processing liquid through the nozzle 360. The ejector 500 may be connected to a tank 510, into which the supplied or recovered processing liquid is stored, through a hose.

The processing liquid supply part 520 may be advantageous when the processing liquid supply part 520 utilizes a forced flow method using a pressure gas. That is, the processing liquid supply part 520 may allow the pressure gas to forcibly flow into the tank 510 so that the processing liquid within the tank 520 is discharged and supplied from the tank 520. The pressure gas may be selected according to chemical properties of the processing liquid to prevent the compressed gas from reacting with the processing liquid. For example, the pressure gas may be a nitrogen gas ($N_2$) when the processing liquid is a nickel alloy.

Further, a valve for opening/closing a connection portion between the tank 510 and the ejector 500 may be disposed on a connection portion between the tank 510 and the processing liquid supply part 520. That is, when the processing liquid is supplied, the valve may connect the tank 510 to the processing liquid supply part 520 and block the connection between the tank 510 and the ejector 500. On the other hand, when the processing liquid is recovered, the valve may connect the tank 510 to the ejector 500 and block the connection between the tank 510 and the processing liquid supply part 520.

Figure 9:
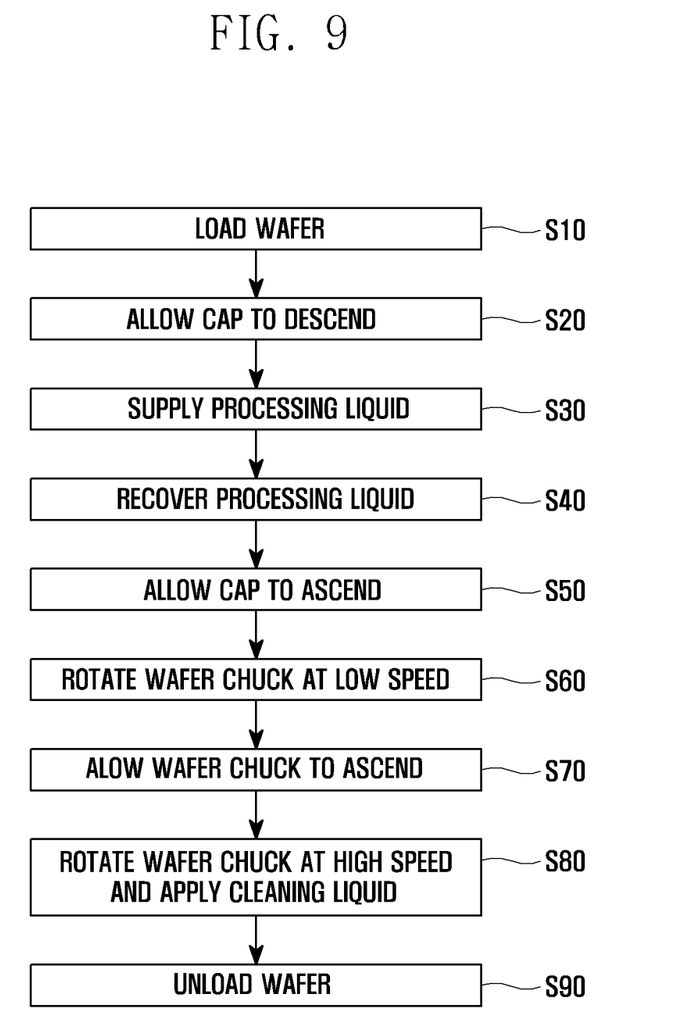
FIG. 9 is a flowchart of a process for manufacturing a semiconductor wafer according to an embodiment of the present invention.

Hereinafter, in the method for manufacturing the semiconductor wafer, a processing process for filling a conductor into the wafer 100 will be described with reference to FIG. 9, and the operations of the apparatus for manufacturing the semiconductor wafer may also be described with reference to FIGS. 1 to 8.

The method for manufacturing the semiconductor wafer according to the present invention may include a plating layer formation process for plating the main processing liquid 110 as one process for forming a plating layer on the wafer 100 and a post-processing process.

The plating layer formation process may be performed as follows.

First, as illustrated in FIG. 3, in operation S10, the wafer 100 is loaded on the wafer chuck 200 in the state where the cap 300 ascends. As illustrated in FIG. 1, in operation S20, the cap 300 descends toward the wafer chuck 200 by the cap elevation device and then is inserted into the outer processing liquid recovery part 420 to surround the wafer 100 fixed to the wafer chuck 200. Here, as the cap 300 descends, the upper chamber 416 of the inner processing liquid recovery part 410 is pushed to the lower side of the wafer 100 fixed to the wafer chuck 200 by the cap to press the elastic member 414. Also, as illustrated in FIG. 2, the outer circumference top surface of the wafer 100 may be sealed by the sealed lip 319 to prevent the processing liquid from leaking to the bottom surface of the wafer even though the processing liquid is stored in the liquid reservoir.

When the cap 300 descends, in operation S30, a process of supplying the processing liquid may be performed as follows. That is, the processing liquid supply part 520 supplies a gas into the tank 510, and thus, the processing liquid stored in the tank 510 is supplied onto the wafer 100 surrounded by the cap 300 due to the generated pressure. Here, when the processing liquid 110 is initially supplied, the processing liquid 110 may be filled up to a predetermined level within the liquid reservoir. Then, when the processing liquid 110 is discharged to overflow through the outer chamber, the processing liquid 110 is discharged to the inner processing liquid recovery part 410 through the discharge hole of the outer chamber. Thus, since the processing liquid 110 is discharged after sufficiently staying in the liquid reservoir of the cap 300, the conductive layer having a high aspect ratio such as a via hole may be stably formed in a surface of the wafer 100. Furthermore, a power may be supplied to each of the first and second electrodes 251 and 252 to drive the first and second electrodes 251 and 252 and simultaneously rotate the second electrode 250. Thus, the plating layer may be uniformly plated and formed on the entire surface of the wafer 100 by the interaction between the first and second electrodes 251 and 250 and the stirring of the processing liquid 110.

When the conductive layer formation process is completely performed on the wafer 100, the ejector 500 may operate to recover the processing liquid 110 supplied through the nozzle 360 in operation S50, and the wafer chuck 200 may rotate at a low space by the chuck rotation device in operation S60. Here, when the cap 300 ascends, the upper chamber 416 of the inner processing liquid recovery part 410 may return to a position that is higher than that wafer 100 fixed to the wafer chuck 200 by the elastic restoring force of the elastic member 414. Thus, when the wafer chuck 200 rotates, the processing liquid 110 remaining on the wafer 100 may be recovered into only the inner processing liquid recovery part 410 without being scattered to the outer processing liquid recovery part 420.

Next, in operation 70, the wafer chuck 200 ascends by the chuck elevation device to locate the wafer 100 to a position that is higher than the inner processing liquid recovery part 410. In operation S80, a cleaning liquid is applied onto the wafer 100 while the wafer 100 rotates at a high speed. Thus, the cleaning liquid may be uniformly applied on the wafer 100 by the rotation of the wafer 100 and also more purely clean the wafer 100 by a centrifugal force. Also, the cleaning liquid applied to the wafer 100 may be scattered by the centrifugal force and discharged into the outer processing liquid recovery part 420. Thus, the wafer 100 may be cleaned by the cleaning liquid, and then quickly dried by rotating wind generated by the rotation of the wafer 100. As described above, the processing liquid may be recovered through the inner processing liquid recovery part 410, and the cleaning liquid may be separated and recovered through the outer processing liquid recovery part 420. As a result, it may prevent the expensive processing liquid from being diluted with the cleaning liquid.

As described above, in operation S90, the wafer chuck 200 is unloaded from the wafer chuck 200 after the post-processing processes such as the conducive layer processing process, the cleaning process, and the drying process are continuously performed by using one equipment.

As described above, since the cap having the sealed lip is disposed on the top surface of the wafer, only a small amount of processing liquid may react to reduce usage of the processing liquid and prevent the rear surface of the wafer and other equipment from being contaminated.

Also, since the processing liquid remaining on the wafer is removed by rotating the wafer chuck, the other process may be performed without moving the wafer to the other equipment.

Also, the processing liquid supply part and the ejector may be provided to increase the recycled proportion of processing liquid.

Also, the processing liquid may be recovered through the inner processing liquid recovery part 410, and the cleaning liquid may be separated and recovered through the outer processing liquid recovery part 420. As a result, it may prevent the expensive processing liquid from being diluted with the cleaning liquid.

Although the exemplary embodiment of the present invention is illustratively described, the technical scope of the present invention is not limited to only the specific embodiment, and thus all suitable modifications and equivalents coming with the scope of the appended claims.

The invention claimed is:

1. An apparatus for manufacturing a semiconductor wafer, the apparatus comprising:
   a wafer chuck supporting and fixing a rear surface of the wafer;
   a chuck rotation part rotating the wafer chuck;
   a chuck elevation device for vertically elevating the wafer chuck;
   a cap elevatably disposed above the wafer chuck, the cap comprising a sealed lip that seals an outer peripheral portion of a top surface of the wafer to define a liquid reservoir;
   a nozzle injecting and recovering a processing liquid into the liquid reservoir;
   a first electrode installed to apply electricity to the wafer;
   a second electrode disposed to vertically face the wafer chuck with the wafer therebetween, the second electrode rotating to stir the processing liquid supplied onto the wafer; and
   a processing liquid recovery part disposed to surround an outer circumference of the wafer fixed to the wafer chuck, thereby recovering a scattered processing liquid, wherein the processing liquid recovery part comprises:
   an inner processing liquid recovery part surrounding the wafer fixed to the wafer chuck in a state where the wafer chuck descends by the chuck elevation device to recover the processing liquid supplied onto the wafer;
   an outer processing liquid recovery part disposed outside the inner processing liquid recovery part to surround the wafer fixed to the wafer chuck, thereby recovering the a scattered processing liquid when the wafer chuck rotates in a state where the wafer chuck ascends to an upper side of the inner processing liquid recovery part by the chuck elevation device; and
   the inner processing liquid recovery part comprises a lower chamber and an upper chamber disposed on the lower chamber so as to be vertically elevated by an elastic member that is vertically elastically deformable.

2. The apparatus of claim 1, further comprising:
   a processing liquid supply part coupled to the nozzle to inject the processing liquid; and
   an ejector coupled to the nozzle to recover the processing liquid.

3. The apparatus of claim 1, wherein the cap further comprises a drain part surrounding an outer circumference of the liquid reservoir so that the processing liquid stored in the liquid reservoir overflows and is discharged.

4. The apparatus of claim 1, wherein the cap further comprises:
   an inner chamber defining the liquid reservoir, the inner chamber allowing the processing liquid to overflow; and
   an outer chamber surrounding an outer circumference of the inner chamber to define a recovery space, in which the overflowing processing liquid is recovered, between the inner chamber and the outer chamber, the outer chamber having a discharge hole in one side of the recovery space.

5. The apparatus of claim 1, wherein the second electrode comprises a plurality of second electrode blade members expanded in a direction that is away from a rotation center of the second electrode and equally divided along a rotational circumferential direction.

6. The apparatus of claim 5, wherein each of the second electrode blade members has a fan shape.

7. The apparatus of claim 1, wherein the inner processing liquid recovery part is disposed under the cap to vertically ascend or descend by the vertical elevation of the cap or is variable in vertical length.

8. The apparatus of claim 1, wherein the elastic member is disposed in the lower chamber, and
   the apparatus further comprises a connection member disposed between the elastic member and the upper chamber to pass through the lower chamber so that the lower chamber is vertically elevatable.

9. The apparatus of claim 8, wherein the upper chamber has a first groove into which the lower chamber is vertically inserted and a second groove that extends upward from the first groove so that the connection member is fitted.

10. The apparatus of claim 1, wherein an upper end of the inner processing liquid recovery part is inclined toward the wafer chuck with respect to a vertical direction.

11. The apparatus of claim 7, wherein an upper end of the outer processing liquid recovery part is inclined toward the wafer chuck with respect to a vertical direction.

12. The apparatus of claim 4, wherein the inner chamber is disposed lower than the outer chamber and has a recovery hole connected to the recovery space of the outer chamber in an upper portion thereof, and
   the cap further comprises an annular skirt spaced a predetermined distance from the inner chamber and surrounded by the inner chamber, the annular skirt being disposed higher than a lower end of the inner chamber and having an upper end disposed higher than that of the inner chamber.

13. The apparatus of claim 12, wherein an outer chamber-side size of the recovery hole of the inner chamber is greater than an inner chamber-side size thereof.

14. The apparatus of claim 12, wherein the upper end of the inner chamber has an inner surface that is vertically disposed and an outer surface that is inclined to be tapered upward.

15. The apparatus of claim 12, wherein the upper end of the inner chamber has a sawtooth shape along a circumferential direction thereof.

16. The apparatus of claim 12, wherein the inner chamber further comprises a drain hole connected to the recovery space in a lower portion thereof that is lower than the recovery hole.

17. The apparatus of claim 16, wherein the drain hole is inclined downward from the inner chamber toward the outer chamber.

18. The apparatus of claim 4, wherein the outer chamber has a dome shape.

19. The apparatus of claim 12, wherein the outer chamber has a dome shape, and the annular skirt is supported by the outer chamber, and
the first electrode is disposed on the wafer chuck and the second electrode that interacts with the first electrode to rotate is disposed on the cap to stir the processing liquid.

20. The apparatus of claim 2, wherein the ejector uses a vacuum manner performed by a compressed air that is introduced and discharged.

21. The apparatus of claim 2, wherein the nozzle is connected to the ejector through a connection tube that is detachably fitted into and coupled to an upper portion of the nozzle.

22. The apparatus of claim 2, further comprising a tank connected to the ejector to store the supplied or recovered processing liquid,
wherein the processing liquid supply part supplies a pressure gas to allow the processing liquid within the tank to forcibly flow into the nozzle, and
the apparatus further comprises a valve connecting the tank to the processing liquid supply part when the processing liquid is supplied and connecting the tank to the ejector when the processing liquid is recovered.

23. An apparatus for manufacturing a semiconductor wafer, the apparatus comprising:
a wafer chuck supporting and fixing a rear surface of the wafer;
a cap elevatably disposed above the wafer chuck, the cap comprising a sealed lip that seals an outer peripheral portion of a top surface of the wafer to define a liquid reservoir;
a nozzle injecting and recovering a processing liquid into the liquid reservoir;
wherein the cap further comprises: an inner chamber defining the liquid reservoir, the inner chamber allowing the processing liquid to overflow; and an outer chamber surrounding an outer circumference of the inner chamber to define a recovery space, in which the overflowing processing liquid is recovered, between the inner chamber and the outer chamber, the outer chamber having a discharge hole in one side of the recovery space, and
wherein the inner chamber is disposed lower than the outer chamber and has a recovery hole connected to the recovery space of the outer chamber in an upper portion thereof, and the cap further comprises an annular skirt spaced a predetermined distance from the inner chamber and surrounded by the inner chamber, the annular skirt being disposed higher than a lower end of the inner chamber and having an upper end disposed higher than that of the inner chamber.

24. The apparatus of claim 23, wherein an outer chamber-side size of the recovery hole of the inner chamber is greater than an inner chamber-side size thereof.

25. The apparatus of claim 23, wherein the upper end of the inner chamber has an inner surface that is vertically disposed and an outer surface that is inclined to be tapered upward.

26. The apparatus of claim 23, wherein the upper end of the inner chamber has a sawtooth shape along a circumferential direction thereof.

27. The apparatus of claim 23, wherein the inner chamber further comprises a drain hole connected to the recovery space in a lower portion thereof that is lower than the recovery hole.

* * * * *